United States Patent
Matsuura et al.

(10) Patent No.: US 6,960,958 B2
(45) Date of Patent: Nov. 1, 2005

(54) PREDISTORTION CIRCUIT, LOW-DISTORTION POWER AMPLIFIER, AND CONTROL METHODS THEREFOR

(75) Inventors: Toru Matsuura, Katano (JP); Kaoru Ishida, Shijonawate (JP); Makoto Sakakura, Uji (JP); Seiji Fujiwara, Yokosuka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 295 days.

(21) Appl. No.: 10/750,910

(22) Filed: Jan. 5, 2004

(65) Prior Publication Data

US 2004/0135631 A1 Jul. 15, 2004

Related U.S. Application Data

(62) Division of application No. 10/395,092, filed on Mar. 25, 2003, which is a division of application No. 09/865,692, filed on May 29, 2001, now Pat. No. 6,590,449.

(30) Foreign Application Priority Data

May 30, 2000 (JP) ........................................ 2000-160550

(51) Int. Cl.[7] ................................................. H03F 1/26
(52) U.S. Cl. ........................................ 330/149; 375/297
(58) Field of Search ................................ 330/149, 136, 330/280; 375/297; 455/63

(56) References Cited

U.S. PATENT DOCUMENTS

| | | | |
|---|---|---|---|
| 5,252,930 A | | 10/1993 | Blauvelt |
| 5,361,156 A | | 11/1994 | Pidgeon |
| 5,999,047 A | | 12/1999 | Zhang et al. |
| 6,091,297 A | * | 7/2000 | Bar-David et al. .......... 330/149 |
| 6,188,279 B1 | | 2/2001 | Yuen et al. |
| 6,211,734 B1 | | 4/2001 | Ahn |
| 6,437,644 B1 | | 8/2002 | Kenington |
| 6,710,652 B2 | * | 3/2004 | Miyaji et al. ................ 330/151 |
| 6,727,751 B2 | * | 4/2004 | Yonenaga et al. .......... 330/151 |

* cited by examiner

*Primary Examiner*—Henry Choe
(74) *Attorney, Agent, or Firm*—Smith, Gambrell & Russell, LLP

(57) ABSTRACT

An amplitude frequency characteristic adjustment circuit 106 is provided downstream of and connected to a distortion generation circuit 105. An amplitude difference between low-frequency-side and high-frequency-side distortion voltages is adjusted by the amplitude frequency characteristic adjustment circuit 106, and then their amplitudes and phases are adjusted by a vector adjustment circuit 107. This configuration makes it possible to suppress simultaneously both of low-frequency-side and high-frequency-side distortion voltages of a distortion generated by a wide-band class-AB power amplifier even if they are different in amplitude and phase.

2 Claims, 17 Drawing Sheets

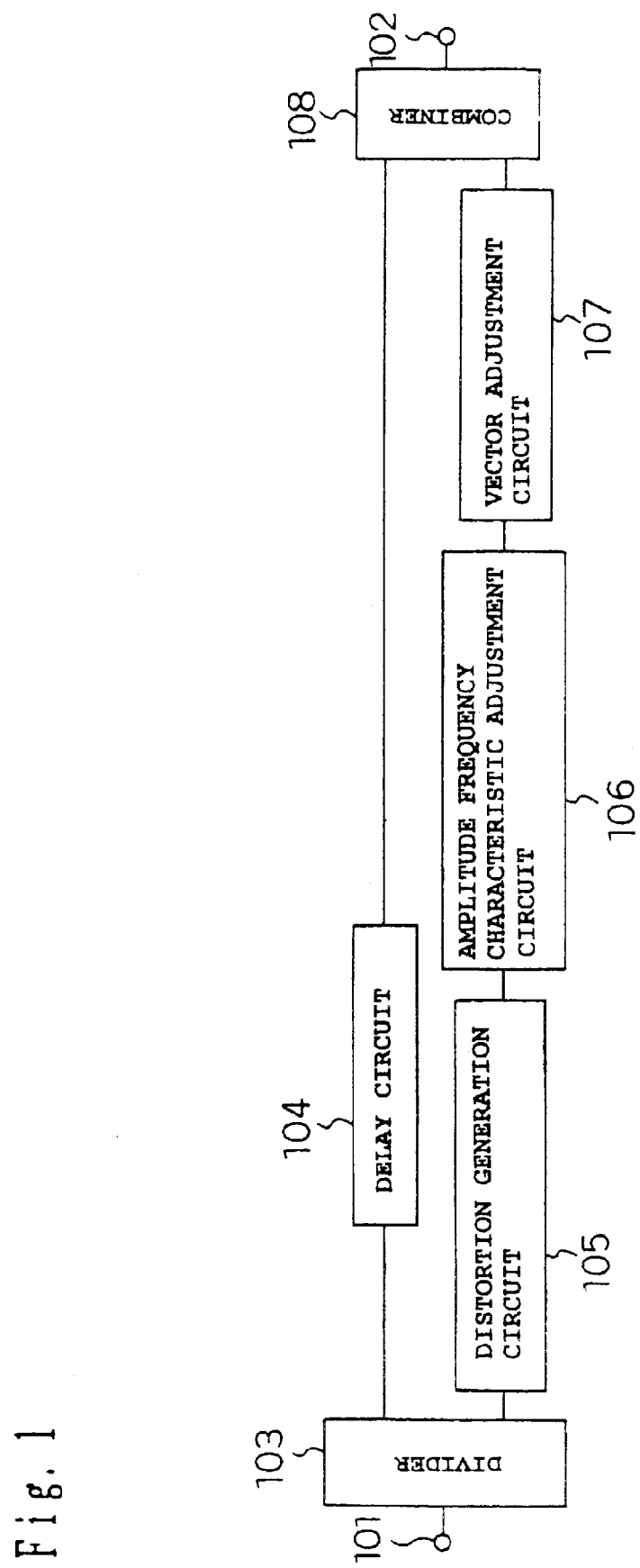

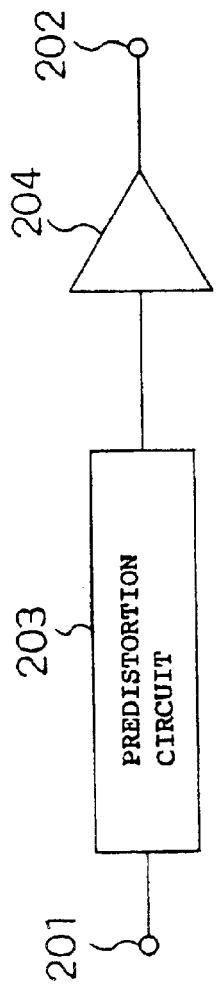
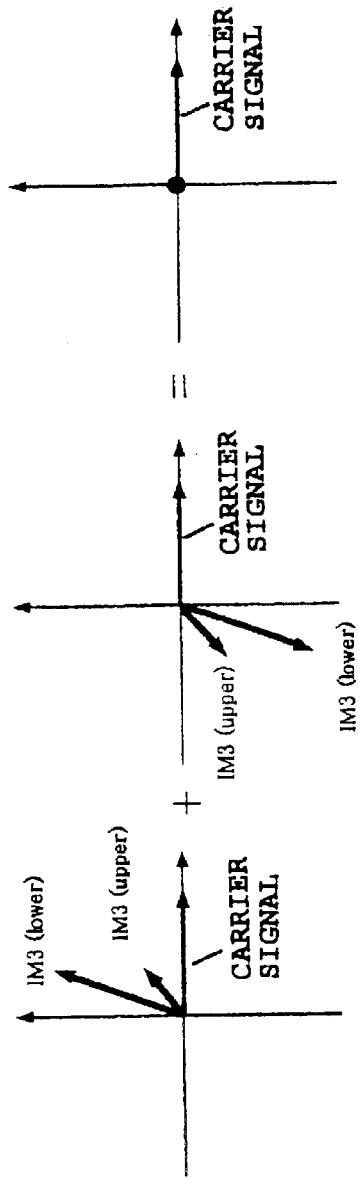
Fig. 2A
Fig. 2B

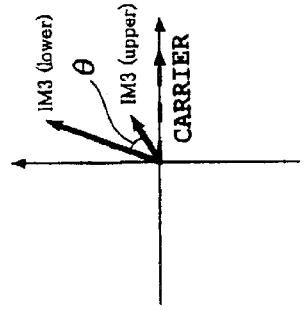

PREDISTORTION CIRCUIT, LOW-DISTORTION POWER AMPLIFIER, AND CONTROL METHODS THEREFOR

CROSS REFERENCE TO RELATED APPLICATION

This application is a division of Ser. No. 10/395,092, filed Mar. 25, 2003, which is a divisional of 09/865,692, filed May 29, 2001 (now U.S. Pat. No. 6,590,449), both of which are being incorporated in their entirety herein by reference.

BACKGROUND OF THE INVENTION

1. Field of the Invention

The present invention relates to linearization of a power amplifier used in a cellular phone and base station, for example, as well as to a low-distortion power amplifier and the like.

2. Description of the Related Art

FIG. 17 shows a conventional predistortion circuit. As shown in FIG. 17, a signal that is input to an input terminal 1701 is divided to two routes by a divider circuit 1703. In the first route, the signal is input to a combiner 1707 via a delay circuit 1704. On the other hand, in the second route, a distortion is generated by a distortion generation circuit 1705 and the signal is input to the combiner 1707 via a vector adjustment circuit 1706. The two signals are combined with each other by the combiner 1707 and a resulting signal is output from an output terminal 1702 and supplied to a power amplifier (not shown). The predistortion circuit generates a signal for suppressing a distortion of the downstream power amplifier by varying the amplitude and phase of a distortion with the vector adjustment circuit 1706, whereby a distortion at the output of the power amplifier is suppressed. The delay time of the delay circuit 1704 is so set as to equalize the delay times of the first and second routes.

However, in particular, where a transmission signal has a wide bandwidth and the power amplifier performs a class-AB operation, the amplitude and phase characteristics of a intermodulation distortion generated by the amplifier lose balance and hence the effect of linearization (for example, suppressing distortion) degrades.

A more detailed description will be made below. It is assumed that the power amplifier is matched in a wide band and that the gain and the pass phase have no deviations in a transmission band. When two signals having different frequencies and the same amplitude are input, the output voltage $V_O$ is given by $$V_O = A_O(\cos \omega_1 t + \cos \omega_2 t) + B_{OL} \cos[(2\omega_1-\omega_2)t+\phi_{3L}] + B_{OU} \cos[(2\omega_2-\omega_1)t+\phi_{3U}] \quad \text{[Equation 1]}$$

where $\omega_1$ and $\omega_2$ are the angular frequencies of the input signals, $A_O$ is the amplitude component of voltages having angular frequencies $\omega_1$ and $\omega_2$ (among the output voltages), $B_{OL}$ and $B_{OU}$ are the amplitude components of third-order intermodulation distortion voltages occurring on the low-frequency side and the high-frequency side, and $\phi_{3L}$ and $\phi_{3U}$ are the phase components of the third-order intermodulation distortion voltages occurring on the low-frequency side and the high-frequency side.

In this case, both intermodulation distortions occurring on the low-frequency side and the high-frequency side can be suppressed for by generating a voltage VI given by the following equation with the lonearizer (for example, predistortion circuit) and inputting it to the power amplifier:

$$V_I = A_I(\cos \omega_1 t + \cos \omega_2 t) - B_{IL} \cos[(2\omega_1-\omega_2)t+\phi_{3L}] - B_{IU} \cos[(2\omega_2-\omega_1)t+\phi_{3U}] \quad \text{[Equation 2]}$$

where $A_I$ is the amplitude component of voltages having angular frequencies $\omega_1$ and $\omega_2$ and $B_{IL}$ and $B_{IU}$ are the amplitude components of third-order intermodulation distortion voltages occurring on the low-frequency side and the high-frequency side in the predistortion circuit. There are relationships $A_O = A_I \cdot G$, $B_{OL} = B_{IL} \cdot G$, and $B_{OU} = B_{IU} \cdot G$, where G is the voltage gain of the power amplifier.

According to the conventional technique, the amplitudes and the phases of third-order intermodulation distortion occurring in the predistortion circuit cannot be controlled independently on the low-frequency side and the high-frequency side. That is, $B_{IL}$, $B_{IU}$, $\phi_{3L}$, and $\phi_{3U}$ cannot be controlled independently.

No particular problems occur with the above conventional linealizer if the amplitude components of third-order intermodulation distortion voltages on the low-frequency side and the high-frequency side are the same and their phase components are also the same.

However, if the amplitude components and/or the phase components of third-order intermodulation distortion voltages on the low-frequency side and the high-frequency side are different from each other as in the case that a transmission signal has a wide bandwidth and the power amplifier performs a class-AB operation, a problem arises that a sufficient linearization (for example, sufficient suppressing distortion) cannot be obtained.

BRIEF SUMMARY OF THE INVENTION

Object of the Invention

The present invention has been made in view of the above problems in the art, and an object of the invention is therefore to provide a predistortion circuit, a low-distortion power amplifier, control methods therefor, etc. in which at least one of the amplitudes and the phases of a distortion on the high-frequency side and the low-frequency side are controlled independently and that are therefore effectively used for a power amplifier having such an unbalanced distortion characteristic.

The 1st invention of the present invention (corresponding to claim 1) is a predistortion circuit comprising:
  a divider for branching an input signal into plural branched signals;
  a delay circuit for delaying one of the branched signals by a predetermined delay time;
  a distortion generating circuit for receiving the other branched signal and for generating a distortion signal;
  a vector adjustment circuit for varying an amplitude and a phase of the distortion signal; and
  a combining circuit for combining an output signal of the delay circuit and an output signal of the vector adjustment circuit and for outputting a combined signal to circuit means as a subject of linearization to be provided downstream of and connected directly or indirectly to the combining circuit,
  wherein the delay time of the delay circuit is set based on a phase difference of a distortion that would be generated by the circuit means if the vector adjustment circuit did not produce the output signal.

The 2nd invention of the present invention (corresponding to claim 2) is a predistortion circuit comprising:
  a divider for branching an input signal into plural branched signals;
  a delay circuit for delaying one of the branched signals by a predetermined delay time;

a distortion generating circuit for receiving the other branched signal and for generating a distortion signal;

an amplitude frequency characteristic adjustment circuit for varying an amplitude frequency characteristic of the distortion signal;

a vector adjustment circuit for varying an amplitude and a phase of the distortion signal that is output from the amplitude frequency characteristic adjustment circuit; and a combining circuit for combining an output signal of the delay circuit and an output signal of the vector adjustment circuit.

The 3rd invention of the present invention is the predistortion circuit according to 2nd invention, wherein the delay time of the delay circuit is set based on a phase difference of a distortion that would be generated by circuit means as a subject of linearization to receive an output signal of the combining circuit if the vector adjustment circuit did not produce the output signal.

The 4th invention of the present invention is the predistortion circuit according to 1st or 3rd inventions, wherein the delay time of the delay circuit is set based on the phase difference in such a manner that a first delay time is so set that a difference between the first delay time and a second delay time substantially equivalent to or corresponding to the phase difference, where the first delay time is the delay time itself and the second delay time is a delay time of a signal that is input to the combining circuit via the distortion generation circuit and the vector adjustment circuit.

The 5th invention of the present invention is the predistortion circuit according to 1st or 3rd inventions, wherein the delay time of the delay circuit is variable.

The 6th invention of the present invention is the predistortion circuit according to 1st or 3rd inventions, wherein the delay time of the delay circuit is fixed at a predetermined value.

The 7th invention of the present invention is a predistortion circuit comprising:

a divider for branching an input signal into plural branched signals;

a delay circuit for receiving one of the branched signals;

a distortion generating circuit for receiving the other branched signal and for generating a distortion signal;

at least two filter circuits for separating the distortion signal into distortion signals having different frequencies;

at least two vector adjustment circuits connected to outputs of the respective filter circuits directly or indirectly, for varying amplitudes and phases of the distortion signals that are output from the respective filter circuits; and a combining circuit for combining an output signal of the delay circuit and combined output signals of the respective vector adjustment circuits.

The 8th invention of the present invention is the predistortion circuit according to 7th invention, further comprising at least two amplitude frequency characteristic adjustment circuits for varying amplitude frequency characteristics of distortion signals that are output from the respective filter circuits, wherein the vector adjustment circuits are connected to outputs of the respective amplitude frequency characteristic adjustment circuits.

The 9th invention of the present invention is the predistortion circuit according to any one of 1st, 2nd, 3rd, 7th, and 8th inventions, wherein the distortion generation circuit comprises a limiter amplifier.

The 10th invention of the present invention is the predistortion circuit according to any one of 1st, 2nd, 3rd, 7th, and 8th inventions, wherein the distortion generation circuit comprises a diode.

The 11th invention of the present invention is the predistortion circuit according to any one of 1st, 2nd, 3rd, 7th, and 8th inventions, wherein the distortion generation circuit comprises a zero-bias diode.

The 12th invention of the present invention is the predistortion circuit according to any one of 1st, 2nd, 3rd, 7th, and 8th inventions, wherein the distortion generation circuit comprises:

a divider for branching an input signal into plural signals;

a delay circuit connected to one output side of the divider;

a circuit connected to the other output side of the divider and comprising a nonlinear device;

a vector adjustment circuit connected to an output side of the circuit comprising the nonlinear device; and a combining circuit for combining an output signal of the delay circuit and an output signal of the vector adjustment circuit.

The 13th invention of the present invention is a low-distortion power amplifier comprising:

a combining circuit for combining an input signal with another signal;

a power amplifier for receiving an output signal of the combining circuit;

a divider for branching an output signal of the power amplifier into plural branched signals;

a distortion extraction circuit for extracting a distortion signal from one of the branched signals;

an amplitude frequency characteristic adjustment circuit for varying an amplitude frequency characteristic of the distortion signal; and a vector adjustment circuit for varying an amplitude and a phase of the distortion signal that is output from the amplitude frequency characteristic adjustment circuit, wherein an output signal of the vector adjustment circuit is input to the combining circuit as said another signal and the other branched signal is output from the low-distortion power amplifier.

The 14th invention of the present invention is a low-distortion power amplifier comprising:

a combining circuit for combining an input signal with another signal;

a power amplifier for receiving an output signal of the combining circuit;

a divider for branching an output signal of the power amplifier into plural branched signals;

a distortion extraction circuit for extracting a distortion signal from one of the branched signals;

at least two filter circuits for separating the distortion signal into distortion signals having different frequencies; and at least two vector adjustment circuits for varying amplitudes and phases of the distortion signals that are output from the respective filter circuits, wherein a signal obtained by combining together output signals of the vector adjustment circuits is input to the combining circuit as said another signal and the other branched signal is output from the low-distortion power amplifier.

The 15th invention of the present invention is a low-distortion power amplifier comprising:

a combining circuit for combining an input signal with another signal;

a power amplifier for receiving an output signal of the combining circuit;

a divider for branching an output signal of the power amplifier into plural branched signals;

a distortion extraction circuit for extracting a distortion signal from one of the branched signals;

at least two filter circuits for separating the distortion signal into distortion signals having different frequencies;

at least two amplitude frequency characteristic adjustment circuits for adjusting amplitude frequency characteristics of the distortion signals that are output from the respective filter circuits; and at least two vector adjustment circuits for varying amplitudes and phases of distortion signals that are output from the respective filter circuits, wherein a signal obtained by combining together output signals of the vector adjustment circuits is input to the combining circuit as said another signal and the other branched signal is output from the low-distortion power amplifier.

The 16th invention of the present invention is a control method for the predistortion circuit according to any one of 1st, 2nd, 3rd, 7th, and 8th inventions, comprising the steps of:

connecting a power amplifier to an output side of the predistortion circuit;

detecting a magnitude of a distortion signal generated by the power amplifier; and controlling at least one of the amplitude frequency characteristic adjustment circuit or circuits, the vector adjustment circuit or circuits, and the delay time of the delay circuit so as to minimize the detected magnitude of the distortion signal.

The 17th invention of the present invention is the control method for the low-distortion power amplifier according to any one of 13th to 15th inventions, comprising the steps of:

detecting a magnitude of the distortion signal that is output from the distortion extraction circuit; and controlling at least one of the amplitude frequency characteristic adjustment circuit or circuits and the vector adjustment circuit or circuits so as to minimize the detected magnitude of the distortion signal.

The 18th invention of the present invention is a linearized power amplifier comprising:

the predistortion circuit according to any one of 1st, 2nd, 3rd, 7th, and 8th inventions;

a power amplifier for receiving an output signal of the predistortion circuit;

a divider for branching an output signal of the power amplifier into plural branched signal;

detecting means of receiving one of the branched signals and detecting an amplitude and a phase of a distortion signal that is output from the power amplifier; and control means of controlling at least one of the amplitude frequency characteristic adjustment circuit or circuits, the vector adjustment circuit or circuits, and the delay circuit of the predistortion circuit so as to minimize a distortion generated by the power amplifier based on an output signal of the distortion amplitude and phase detecting means, wherein the other branched signal becomes at least one output signal of the linearized power amplifier.

The 19th invention of the present invention is a feedforward amplifier having a predistortion circuit, comprising:

a divider for branching an input signal into plural branched signals;

a first vector adjustment circuit for varying an amplitude and a phase of one of the branched signals;

the predistortion circuit according to any one of claims 1st, 2nd, 3rd, 7th, and 8th inventions for receiving an output signal of the first vector adjustment circuit;

a first power amplifier for receiving an output signal of the predistortion circuit;

first distortion level detecting means of detecting a magnitude of a distortion component included in an output signal of the first power amplifier;

a first delay circuit for receiving the other branched signal;

a first combining circuit for combining an output signal of the first delay circuit and the output signal of the first power amplifier;

a second delay circuit for delaying the output signal of the first power amplifier;

signal level detecting means of detecting a magnitude of an output signal of the first combining circuit;

a second vector adjustment circuit for varying an amplitude and a phase of the output signal of the first combining circuit;

a second power amplifier for receiving an output signal of the second vector adjustment circuit;

a second combining circuit for combining an output signal of the second power amplifier and an output signal of the second delay circuit;

second distortion level detecting means of detecting a magnitude of a distortion component included in an output signal of the second combining circuit; and control means of controlling the predistortion circuit, the first vector adjustment circuit, and the second vector adjustment circuit based on output signals of the first distortion level detecting means, the signal level detecting means, and the second distortion level detecting means, respectively, wherein the control means repeatedly performs, in arbitrary order, a first control of controlling at least the predistortion circuit so as to minimize a distortion level detected by the first distortion level detecting means, a second control of controlling at least the first vector adjustment circuit so as to minimize a signal level detected by the signal level detecting means, and a third control of controlling at least the second vector adjustment circuit so as to minimize a distortion level detected by the second distortion level detecting means.

The 20th invention of the present invention is the feedforward amplifier having a predistortion circuit according to 19th invention, wherein:

the first delay circuit is a variable delay circuit whose delay time is variable;

a variation amount of a delay time when each of the first vector adjustment circuit and the predistortion circuit was controlled is stored in the control means; and the control means controls the predistortion circuit and the variable delay circuit as the first control, controls the first vector adjustment circuit and the variable delay circuit as the second control, and controls only the second vector adjustment circuit as the third control.

The 21st invention of the present invention is a predistortion circuit comprising:

a divider for branching an input signal into plural branched signals;

a delay circuit for delaying one of the branched signals by a predetermined delay time;

a distortion generating circuit for receiving the other branched signal and for generating a distortion signal;

a vector adjustment circuit for varying an amplitude and a phase of the distortion signal; and an amplitude frequency characteristic adjustment circuit for varying an amplitude frequency characteristic of the distortion signal that is output from the vector adjustment circuit;

a combining circuit for combining an output signal of the delay circuit and an output signal of the vector adjustment circuit.

BRIEF DESCRIPTION OF THE DRAWINGS

FIG. 1 is a block diagram showing the configuration of a predistortion circuit according to a first embodiment of the present invention;

FIG. 2A shows how the predistortion circuit and a power amplifier are connected to each other;

FIG. 2B illustrates a characteristic that the predistortion circuit is required to have;

FIGS. 3A–3D illustrate the principle of the predistortion circuit according to the invention;

DESCRIPTION OF SYMBOLS

Figure 4A:
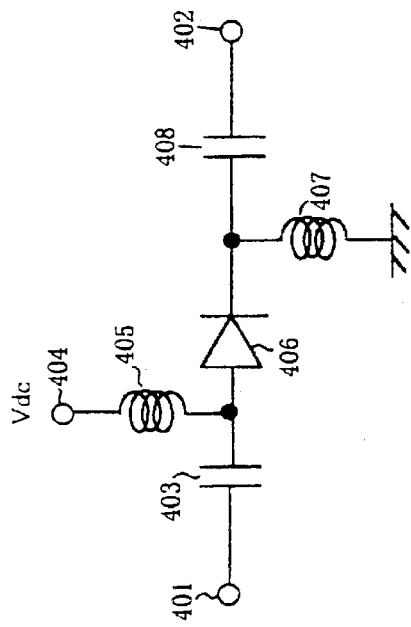
FIG. 4A shows an example of a distortion generation circuit using a diode in the first embodiment of the invention.

101 Input terminal
102 Output terminal
103 Divider
104 Delay circuit
105 Distortion generation circuit
106 Amplitude frequency characteristic adjustment circuit
107 Vector adjustment circuit
108 Combiner
203 Predistortion circuit
204 Power amplifier
403, 408 Capacitor
404 Power supply terminal
405, 407 Inductor
406 Diode
413 Circuit including a nonlinear device
503 Transmission line
504 Variable capacitor
603, 604 Directional coupler
605, 606 Resistance with variable values
704 Variable delay circuit
1306 Distortion extraction circuit
1506 Distortion amplitude/phase detecting means
1507 Control means
1508 Control terminal
1608, 1619 Distortion level detecting means
1614 Signal level detecting means

DETAILED DESCRIPTION OF THE PREFERRED EMBODIMENTS

Embodiment 1

A first embodiment of the present invention will be hereinafter described with reference to FIGS. 1–8.

Referring to FIG. 1, a signal that is input to an input terminal 101 is branched into two signals by a divider 103. One branched signal is input to a combiner 108 via a delay circuit 104. The other output signal of the divider 103 is input to a distortion generation circuit 105, where a distortion signal is generated. After the frequency characteristic of the amplitude of the distortion signal is varied by an amplitude frequency characteristic adjustment circuit 106, the amplitude and the phase of the distortion signal are varied by a vector adjustment circuit 107. A resulting signal is input to a combiner 108. A distortion of a downstream power amplifier can be suppressed for by using an output at an output terminal 102 of the combiner 108.

A specific example in which an input signal is two continuous waves having the same amplitude and different frequencies will be described with reference to FIGS. 1–3.

Referring to FIGS. 2A and 2B, a distortion generated by a power amplifier 204 can be suppressed for by generating, with a predistortion circuit 203, a distortion having the same amplitude (that is normalized by the amplitude of a carrier) as the distortion generated by the power amplifier 204 and the opposite phase (that is, difference between phases of intermodulation distortion signals is 180 degrees) to the phase of the distortion generated by the power amplifier 204 and inputting it to the power amplifier 204. The phase of distortion signal is defined as the difference between $\theta_2$ and $\theta_1$ (that is, $\theta_2-\theta_1$), wherein the phase when the phases of two carrier signals become the same is defined as $\theta_1$ and the momentary phase of the distortion signal at that time is defined as $\theta_2$. However, it is difficult to obtain desired amplitude and phase of the intermodulation distortion signals directly. In view of this, the predistortion circuit 203 is given the configuration of FIG. 1.

That is, an input terminal 201 corresponds to the input terminal 101 in FIG. 1 and the power amplifier 204 is connected to the output terminal 102 in FIG. 1.

This embodiment will be described for a case where the amplitude components and phase components of third-order intermodulation distortion voltages of the power amplifier 204 on the low-frequency side and the high-frequency side are different from each other and their phase components are also different from each other, that is, the power amplifier as a subject of linearization (for example, suppressing distortion) and the predistortion circuit are different in both of the amplitude characteristic and the phase characteristic of the distortion characteristic.

As shown in FIG. 3A, it is assumed that third-order intermodulation distortion voltages IM3 on the low-frequency side and the high-frequency side generated by the distortion generation circuit 105 in FIG. 1 have the same amplitude and phase. As shown in FIG. 3B, the amplitude frequency characteristic adjustment circuit 106 adjusts the distortion voltages on the low-frequency side and the high-frequency side so that their amplitude ratio becomes equal to a prescribed value. Then, as shown in FIG. 3C, the vector adjustment circuit 107 adjusts the amplitudes and the phases of the respective distortion voltages to prescribed values. Finally, as shown in FIG. 3D, the voltages of intermodulation distortion signals are given a prescribed phase difference θ by using a delay time that is set in advance by the delay circuit 104.

A description will be made of the phase difference θ between distortion voltages (see FIG. 3D) and the delay time of the delay circuit 104.

Referring to FIG. 1, the delay time of a signal that is input to the combiner 108 via the delay circuit 104 is now called a first delay time and the delay time of a signal that is input to the combiner 108 via the distortion generation circuit 105, the amplitude frequency characteristic adjustment circuit 106, and the vector adjustment circuit 107 is now called a second delay time. The first delay time is set in advance in the designing stage of the predistortion circuit so that the difference between the first and second delay times becomes substantially equal to the above-mentioned phase difference θ. The prescribed value θ is equal to the difference between the phase components of third-order intermodulation distortion voltage on the low-frequency side and the high-frequency side generated by the power amplifier 204 (the difference between the phase components is defined as the difference between the phases of a low-frequency-side distortion voltage and a high-frequency-side distortion voltage with respect to the same phase of two carrier signals).

The predistortion circuit 203 is given the desired characteristic in this manner and the distortion of the power amplifier 204 can thereby be suppressed for.

Although the distortion generation circuit 105 may be formed by using a limiter amplifier, a configuration shown in FIG. 4A is also possible that uses a diode. In the configuration of FIG. 4A, a signal is input to an input terminal 401 and output from an output terminal 402. A diode 406 is biased being supplied with a voltage from a power supply terminal 404. A configuration that does not require supply of power is possible by making the diode 406 a zero-bias diode and grounding the power supply terminal 404.

Figure 4B:
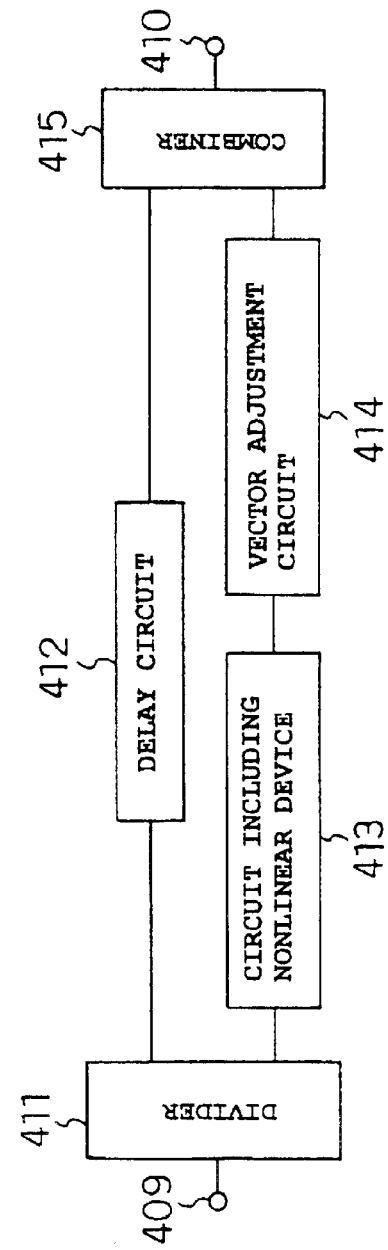
FIG. 4B shows another example of the distortion generation circuit in the first embodiment of the invention.

FIG. 4B shows another configuration of the distortion generation circuit 105. As shown in FIG. 4B, a signal that is input to an input terminal 409 is branched (devided) into two signals by a divider 411. One branched (devided) signal is input to a combiner 415 via a delay circuit 412. The other branched (devided) signal is input to a circuit 413 including a nonlinear device and a signal including a distortion component is output from the circuit 413. The amplitude and the phase of the output signal of the circuit 413 are adjusted by a vector adjustment circuit 414 and a resulting signal is input to the combiner 415. By causing the two carrier signals that are input to the combiner 415 to have the same amplitude and a difference of 180° between phases of these signals, carrier components are suppressed and only a distortion component is obtained at the output of the combiner 415.

Figure 5:
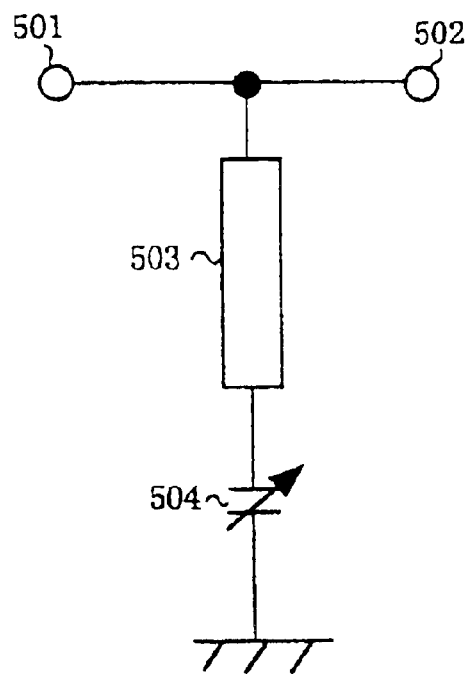
FIG. 5 shows an example of an amplitude frequency characteristic adjustment circuit in the first embodiment of the invention.

For example, the amplitude frequency characteristic adjustment circuit 106 may be a circuit shown in FIG. 5. Referring to FIG. 5, the amplitude frequency characteristic can be varied by varying the capacitance values of a capacitor 504.

Figure 6:
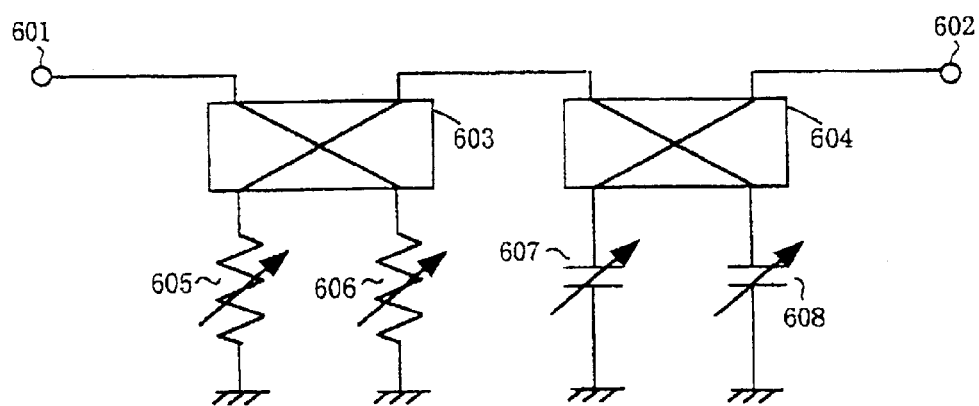
FIG. 6 shows an example of a vector adjustment circuit in the first embodiment of the invention.

For example, the vector adjustment circuit 107 may be a circuit shown in FIG. 6. Referring to FIG. 6, the amplitude attenuation amount can be varied by changing the resistance values of resistors 605 and 606 and the pass phase can be varied by changing the capacitance values of capacitors 607 and 608.

By employing, as the delay circuit 104 (see FIG. 1), a variable delay circuit 704 (see FIG. 7) whose delay time is variable, the phase difference between distortion voltages on the low-frequency side and the high-frequency side can be adjusted.

Figure 7:
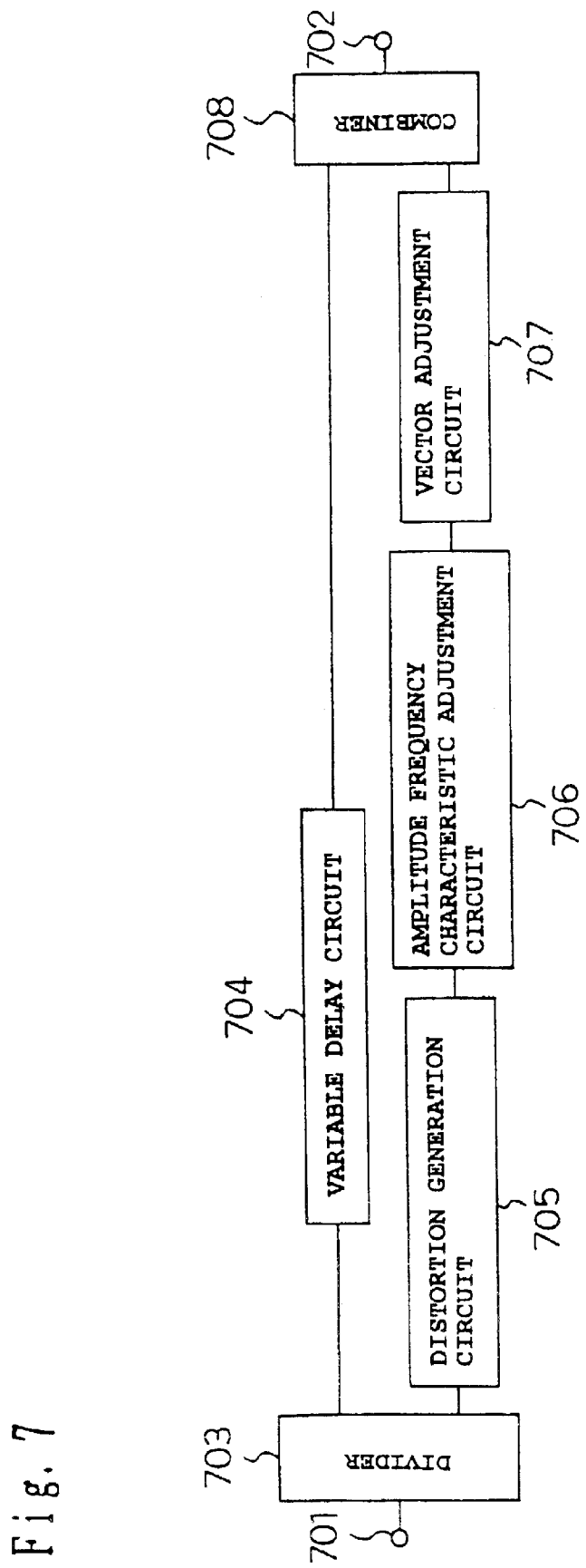
FIG. 7 is a block diagram of a predistortion circuit according to the first embodiment of the invention using a variable delay circuit.
Figure 8:
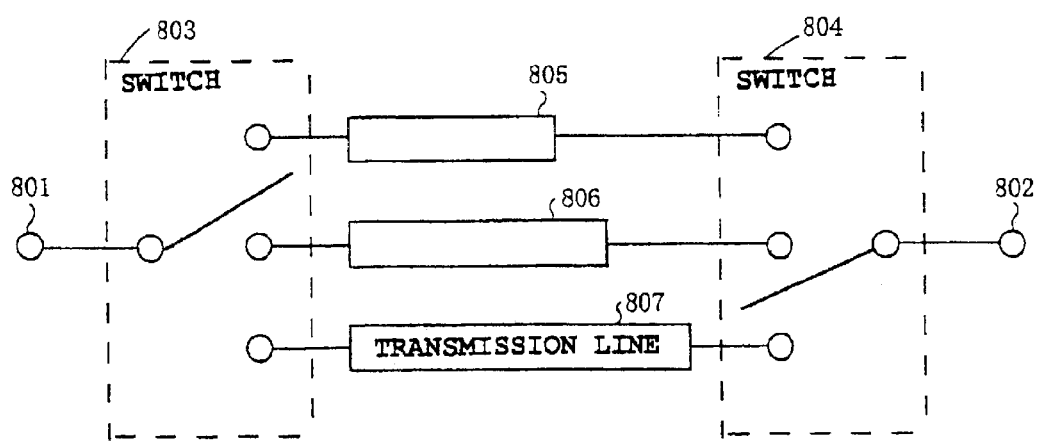
FIG. 8 shows an example of a variable delay circuit in the first embodiment of the invention.

FIG. 7 shows a predistortion circuit of this case. FIG. 8 shows an example of the variable delay circuit 704.

BY switching among transmission lines 805–807 using switches 803 and 804, the delay time can be varied.

For example, even if the characteristic of a downstream amplifier is determined, preparing a plurality of delay times in this manner enables fine adjustment of the delay time, which in turn makes it possible to absorb a deviation in adjustment of the delay time due to variations in the characteristic of the amplifier and other circuits. Even if there are a plural kinds of characteristics of a downstream amplifier and hence the characteristic cannot be determined in advance, preparing a plurality of delay times in advance enables selection of a delay time suitable for the characteristic of an amplifier that is actually connected to the predistortion circuit.

In this case, the amplitude frequency characteristic adjustment circuit 106 or 706 can be omitted if the ratio of the magnitude of two distortion signals generated by the distortion generating circuit and the ratio of the magnitude of two distortion signals the power amplifier are equal.

Highly accurate suppressing distortion can be attained in a stable manner by extracting all or a part of distortion component of a power amplifier connected to the output of this predistortion circuit and controlling at least one of the delay circuit 104 (delay time), the amplitude frequency characteristic adjustment circuit 106, and the vector adjustment circuit 107 so as to minimize the magnitude of the extracted distortion component.

Although the above description is directed to the adjustment of the amplitudes and the phases of third-order intermodulation distortion voltages on the low-frequency side and the high-frequency side, similar effects can also be obtained for the adjustment of the amplitudes and the phases of a third-order intermodulation distortion voltage and a fifth-order intermodulation distortion voltage.

This embodiment also provides an effect of suppressing a distortion that occurs when a modulated wave is input.

Embodiment 2

A second embodiment of the invention will be hereinafter described with reference to FIGS. 9 and 10.

Figure 9:
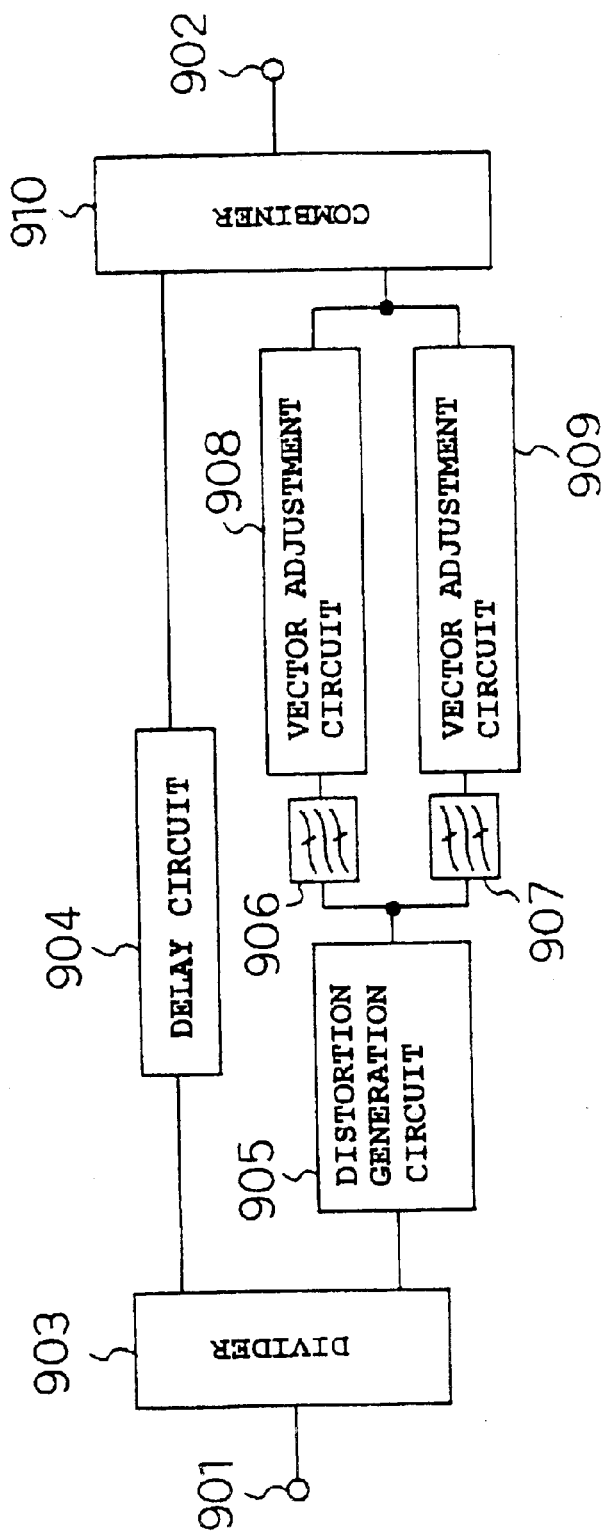
FIG. 9 is a block diagram showing the configuration of a predistortion circuit according to a second embodiment of the invention.

As shown in FIG. 9, a signal that is input to an input terminal 901 is branched into two signals by a divider 903. One branched signal is input to a combiner 910 via a delay circuit 904. The other output of the divider 903 is input to a distortion generation circuit 905, where a distortion signal is generated.

Also in this embodiment, a specific example will be described in which an input signal is two continuous waves having the same amplitude and different frequencies.

A filter circuit 906 selectively passes only a third-order intermodulation distortion voltage on the low-frequency side of a third-order intermodulation distortion generated by the distortion generation circuit 905 and attenuates the other frequency component A filter circuit 907 selectively passes only a third-order intermodulation distortion voltage on the high-frequency side and attenuates the other frequency components.

Of the third-order intermodulation distortion generated by the distortion generation circuit 905, the third-order intermodulation distortion voltage on the low-frequency side passes through the filter circuit 906 and its amplitude and phase are varied by a vector adjustment circuit 908. The third-order intermodulation distortion voltage on the high-frequency side passes through the filter circuit 907 and its amplitude and phase are varied by a vector adjustment circuit 909. Outputs of the vector adjustment circuits 908 and 909 are combined together and then input to a combiner 910. Since in this manner third-order intermodulation distortion voltages on the low-frequency side and the high-frequency side can be controlled independently, a distortion of a power amplifier having an unbalanced distortion characteristic can be suppressed for. This embodiment also provides an effect of suppressing a distortion that occurs when a modulated wave is input.

This embodiment is different from the first embodiment in that the vector adjustment circuits 908 and 909 are adjusted so that the difference between the phase of a distortion that is output from the vector adjustment circuit 908 with respect to the phase of two carrier signals having the same phase and the phase of a distortion that is output from the vector adjustment circuit 909 with respect to phase of those carrier signals becomes equal to the above-mentioned prescribed value θ.

Highly accurate suppressing distortion can be attained in a stable manner by extracting all or a part of a distortion component of a power amplifier connected to the output of this predistortion circuit and controlling at least one of the vector adjustment circuits 908 and 909 so as to minimize the magnitude of the extracted distortion component.

Although the configuration of FIG. 9 is directed to the adjustment of the amplitudes and the phases of third-order intermodulation distortion voltages on the low-frequency side and the high-frequency side, the invention is not limited to such a case. For example, a configuration of FIG. 10 is also possible.

Figure 10:
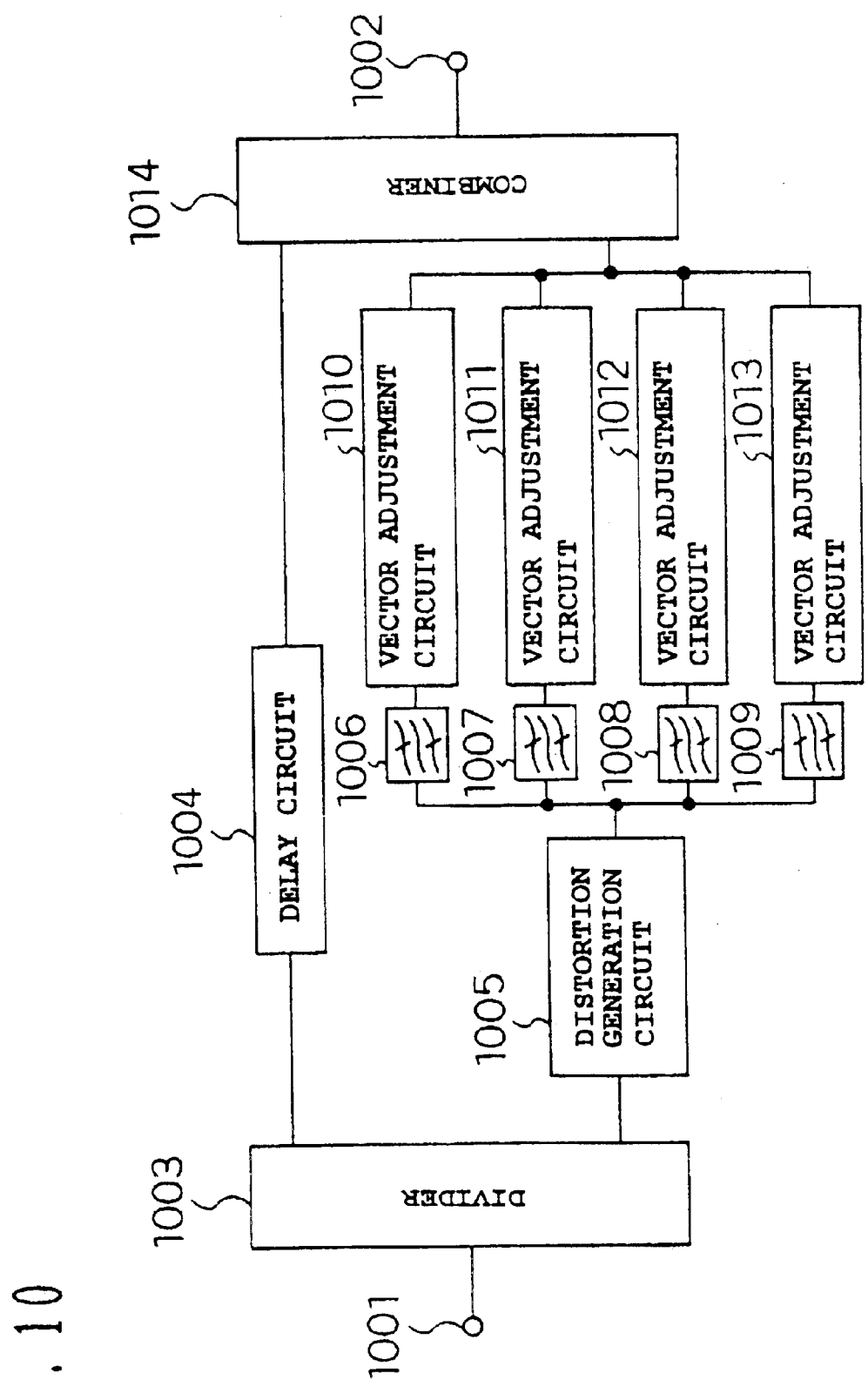
FIG. 10 is a block diagram showing the configuration of another predistortion circuit according to the second embodiment of the invention.

Referring to FIG. 10, a filter circuit 1006 selectively passes a third-order intermodulation distortion voltage on the low-frequency side and attenuates the other frequency components. A filter circuit 1007 selectively passes a third-order intermodulation distortion voltage on the high-frequency side and attenuates the other frequency components. A filter circuit 1008 selectively passes a fifth-order intermodulation distortion voltage on the low-frequency side and attenuates the other frequency components. A filter circuit 1009 selectively passes a fifth-order intermodulation distortion voltage on the high-frequency side and attenuates the other frequency components.

This configuration makes it possible to independently control the amplitudes and the phases of third-order intermodulation distortion voltages and the amplitudes and the phases of fifth-order intermodulation distortion voltages, and thereby provides the same effect of suppressing distortion as in the above example.

Figure 11:
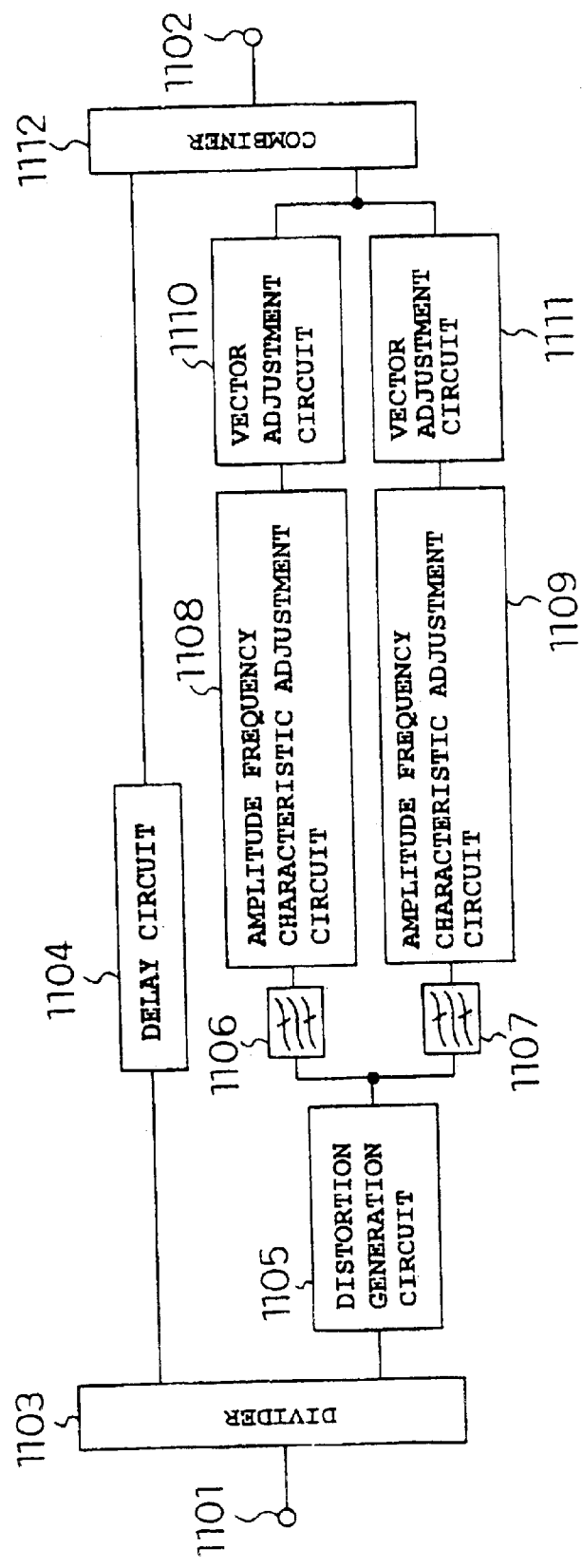
FIG. 11 is a block diagram showing the configuration of a further predistortion circuit according to the second embodiment of the invention.

A configuration shown in FIG. 11 is also possible.

As shown in FIG. 11, a distortion signal generated by a distortion generation circuit 1105 is frequency-separated by filter circuits 1106 and 1107.

For example, where a plurality of distortion signals are included in outputs of the filter circuits 1106 and 1107, those distortion signals are subjected to adjustment of the amplitude frequency characteristic in amplitude frequency characteristic adjustment circuits 1108 and 1109 and amplitude and phase adjustment in vector adjustment circuits 1110 and 1111. Resulting signals are input to a combiner 1112, where it is combined with a signal that went through a delay circuit 1104.

This configuration enables suppressing distortion even on distortion components having a plurality of frequencies.

Although in this embodiment the number of filters for separating components having different frequencies from each other is two or four, the invention is not limited to such a case.

Embodiment 3

A third embodiment will be hereinafter described with reference to FIGS. 12 and 13.

Figure 12:
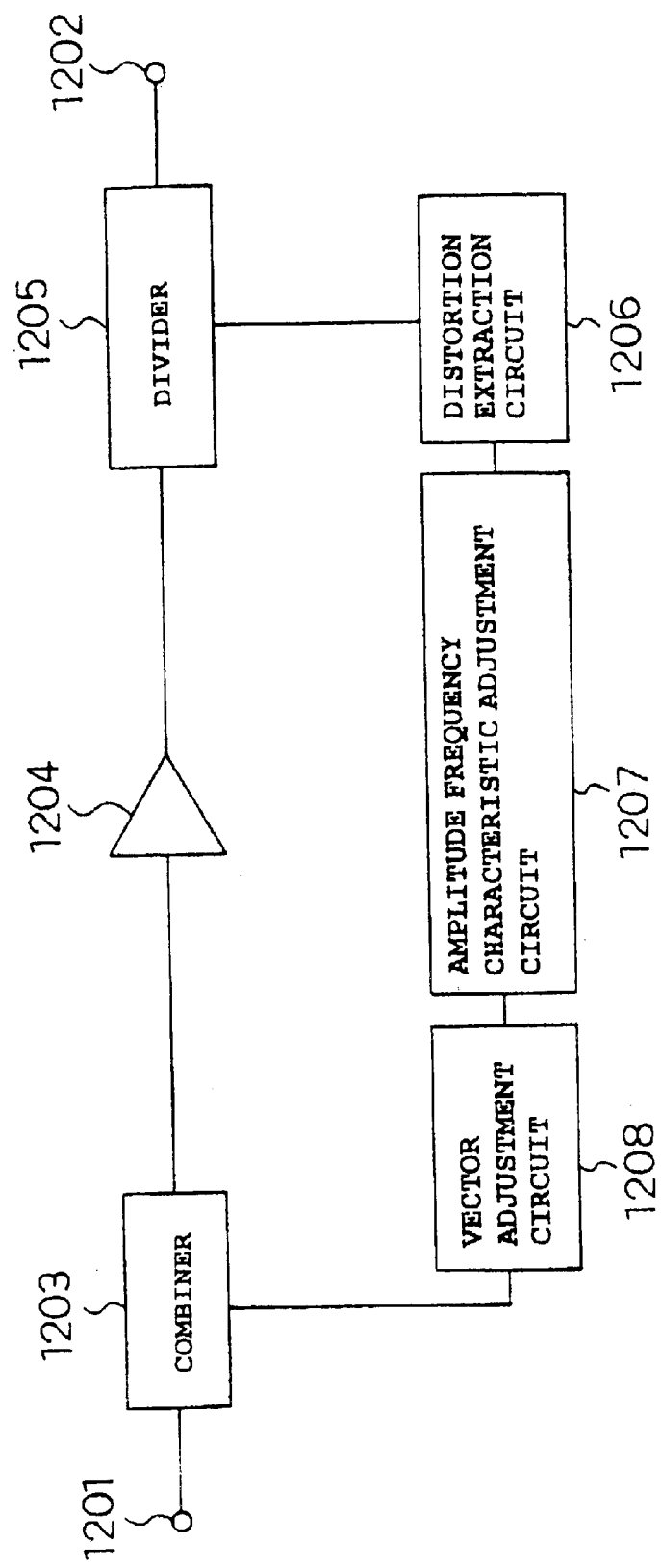
FIG. 12 is a block diagram showing the configuration of a low-distortion power amplifier according to a third embodiment of the invention.

Referring to FIG. 12, a signal that is input to an input terminal 1201 is input to a power amplifier 1204 via a combiner 1203. An output of the power amplifier 1204 is branched into two signals by a divider 1205. A distortion component is extracted from one branched signal by a distortion extraction circuit 1206. The amplitude frequency characteristic of the extracted distortion component is varied by an amplitude frequency characteristic adjustment circuit 1207 and the amplitude and the phase of a resulting distortion signal are varied by a vector adjustment circuit 1208. A resulting signal is input to the combiner 1203 and thereby fed back to the input of the power amplifier 1204. The other output of the divider 1205 is connected to an output terminal 1202. A signal is taken out from the output terminal 1202. A low distortion signal can be obtained by properly controlling the amplitude frequency characteristic adjustment circuit 1207 and the vector adjustment circuit 1208.

Highly accurate linearization can be attained in a stable manner by controlling the amplitude frequency characteristic adjustment circuit 1207 and the vector adjustment circuit 1208 so as to minimize the magnitude of a distortion component extracted by the distortion extraction circuit 1206.

Having the amplitude frequency characteristic adjustment circuit 1207, the circuit of FIG. 12 is particularly effective in a case where the amplitude of a distortion signal generated actually by the power amplifier 1204 is different from the amplitude of a distortion signal extracted by the distortion extraction circuit 1206.

Figure 13:
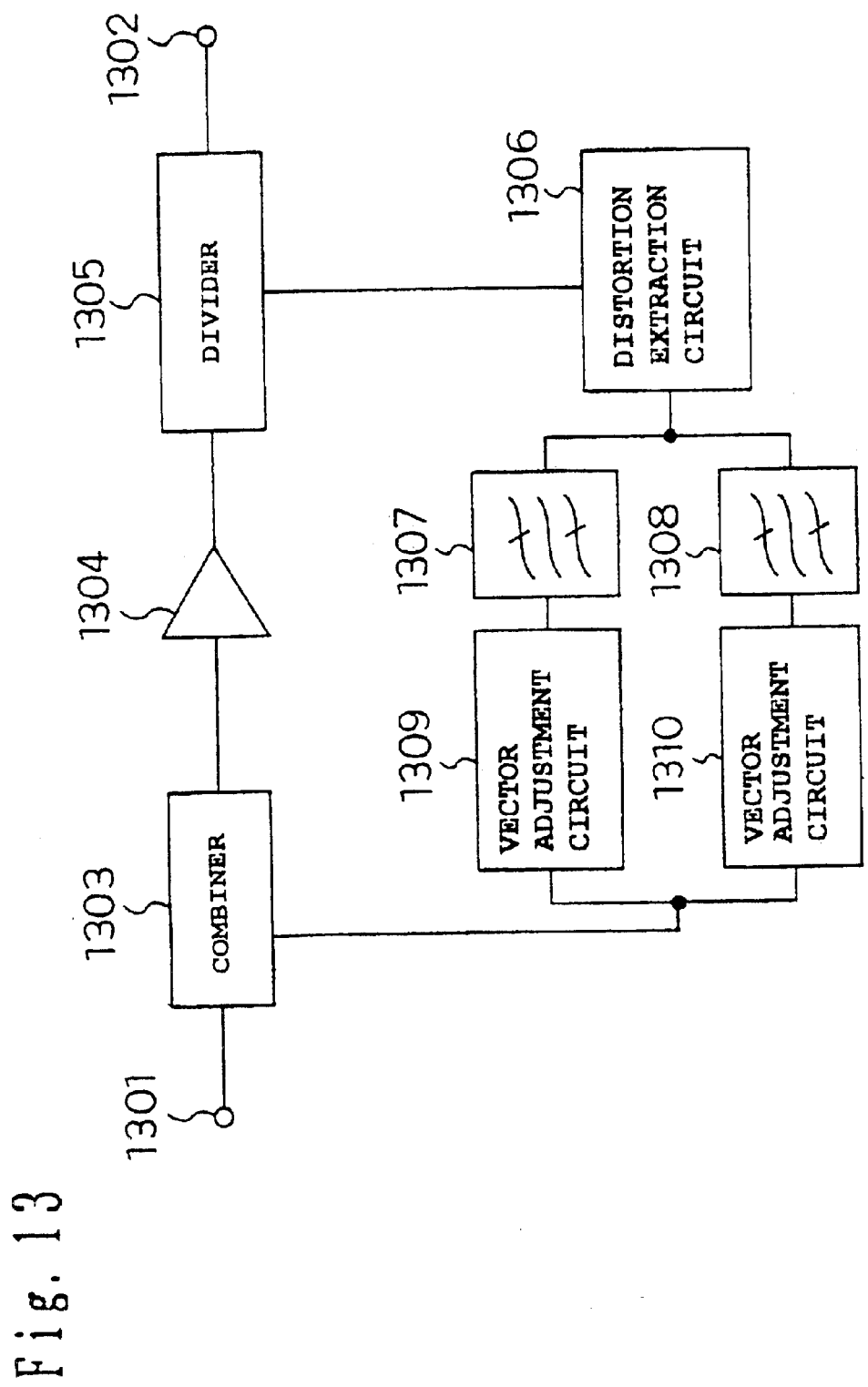
FIG. 13 is a block diagram showing the configuration of another low-distortion power amplifier according to a third embodiment of the invention.

A configuration of FIG. 13 is possible that is a circuit of frequency-separating a distortion signal included in a feedback signal and controlling the amplitude and the phase independently.

Referring to FIG. 13, a filter circuit 1307 selectively passes a third-order intermodulation distortion voltage on the low-frequency side of a third-order intermodulation distortion generated by a power amplifier 1304 and attenuates the other frequency components. A filter circuit 1308 selectively passes a third-order intermodulation distortion voltage on the high-frequency side by a power amplifier 1304 and attenuates the other frequency components.

Therefore, a distortion signal generated by the power amplifier 1304 goes through a divider 1305 and is subjected to distortion extraction in the distortion extraction circuit 1306. A low-frequency-side third-order intermodulation distortion voltage passes through the filter circuit 1307 and its amplitude and phase are varied by a vector adjustment circuit 1309.

A high-frequency-side third-order intermodulation distortion voltage passes through the filter circuit 1308 and its amplitude and phase are varied by a vector adjustment circuit 1310.

The two distortion signals are combined and then input to a combiner 1303.

The low-frequency-side third-order intermodulation distortion voltage is suppressed by properly setting the amplitude variation amount and the phase variation amount of the vector adjustment circuit 1309, and the high-frequency-side third-order intermodulation distortion voltage is suppressed by properly setting the amplitude variation amount and the phase variation amount of the vector adjustment circuit 1310.

This configuration also provides an effect of suppressing a distortion that occurs when a modulated wave is input.

Highly accurate linearization can be attained in a stable manner by controlling the vector adjustment circuits 1309 and 1310 so as to minimize the magnitude of a distortion signal extracted by the distortion extraction circuit 1306.

Figure 14:
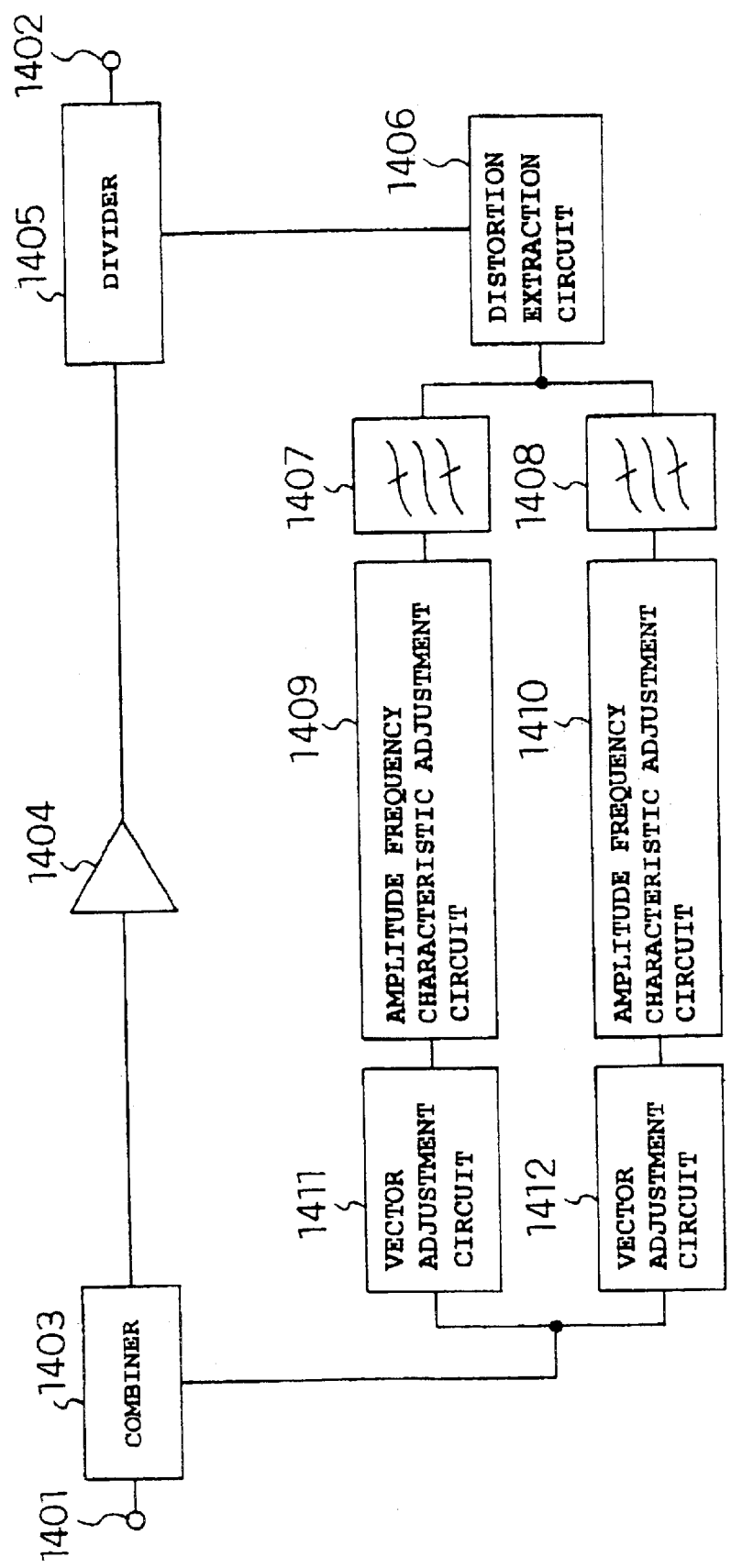
FIG. 14 is a block diagram showing the configuration of a further low-distortion power amplifier according to a third embodiment of the invention.

A configuration shown in FIG. 14 is also possible.

Referring to FIG. 14, a distortion signal extracted by a distortion extraction circuit 1406 is frequency-separated by filter circuits 1407 and 1408. The amplitude frequency characteristics of resulting distortion signals are adjusted by respective amplitude frequency characteristic adjustment circuits 1409 and 1410, and then their amplitudes and phases are adjusted by respective vector adjustment circuits 1411 and 1412. Resulting signals are input to a combiner 1403.

This configuration provides a distortion suppressing effect for distortion signals having a plurality of frequencies.

Although in the above embodiment the number of filters for separating components having different frequencies from each other is two, the invention is not limited to such a case.

Having the amplitude frequency characteristic adjustment circuits 1409 and 1410, the circuit of FIG. 14 is particularly effective in a case where the amplitude of a distortion signal generated actually by the power amplifier 1404 is different from the amplitude of a distortion signal extracted by the distortion extraction circuit 1406.

Embodiment 4

Figure 15:
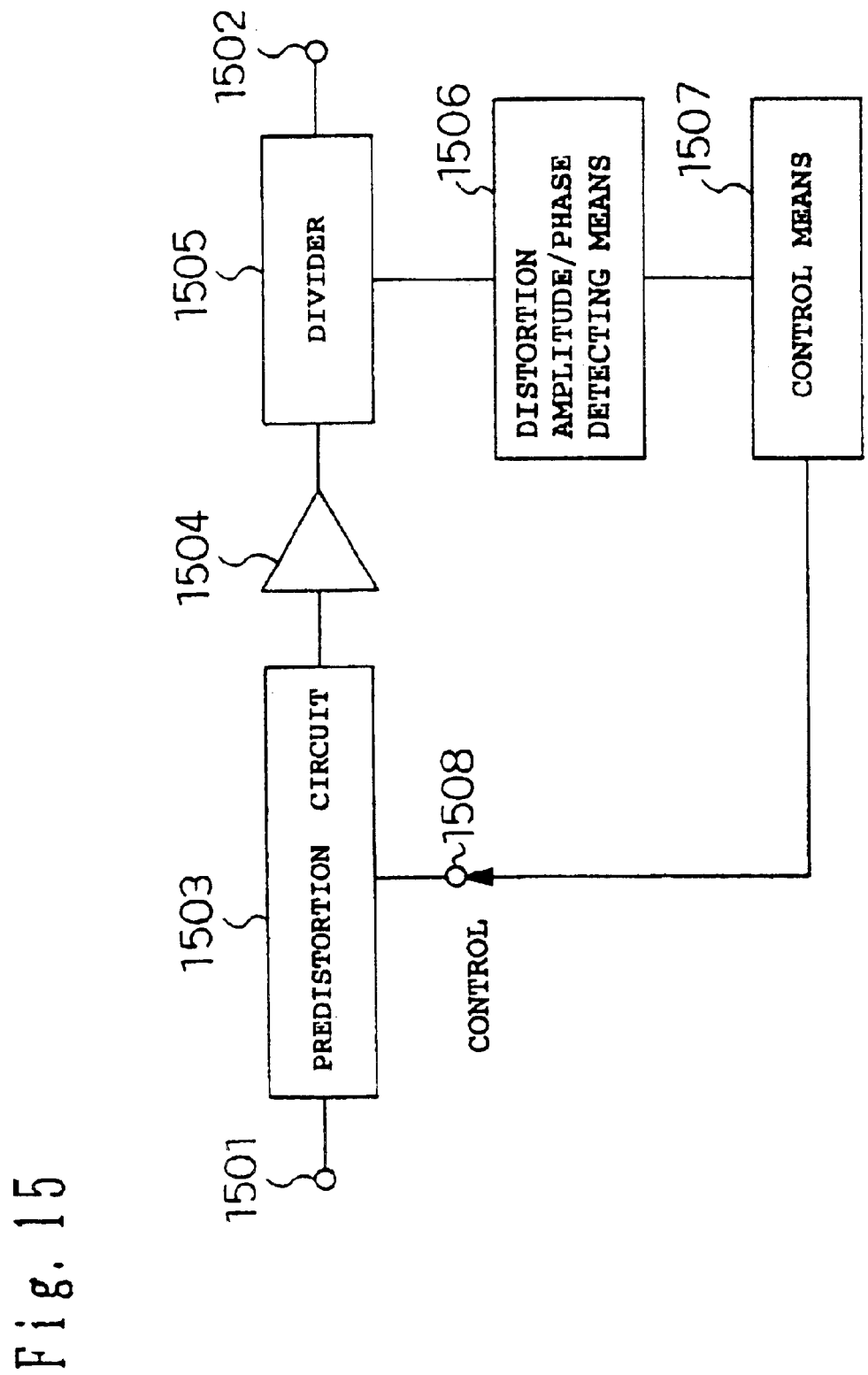
FIG. 15 is a block diagram showing the configuration of a linearized power amplifier according to a fourth embodiment of the invention.

A fourth embodiment of the invention will be hereinafter described with reference to FIG. 15. In FIG. 15, a predistortion circuit 1503 is one of the predistortion circuits of FIGS. 1, 7, 9, 10, and 11 according to first and second embodiments.

A signal that is input to an input terminal 1501 is given a distortion by the predistortion circuit 1503 and a resulting signal is input to a power amplifier 1504.

An output signal of the power amplifier 1504 is branched by a divider 1505. One output signal of the divider 1505 is output from the circuit of FIG. 15 as a power-amplified signal. The other output signal of the divider 1505 is input to a distortion amplitude/phase detecting means 1506. A control means 1507 calculates optimum values of adjustment points of the amplitude frequency characteristic adjustment circuit, the vector adjustment circuit, and the variable delay circuit (delay time) so as to minimize the magnitude of the distortion signal, and inputs calculation results to a control terminal 1508 of the predistortion circuit 1503.

As a result, the adjustment points of the predistortion circuit 1503 such as those of the amplitude frequency characteristic adjustment circuit, the vector adjustment circuit, and the variable delay circuit (delay time) can reach, at high speed, optimum values that provides a maximum distortion suppressing effect.

For example, the amplitude and phase of a distortion can be detected by Fourier-transforming a time-domain signal that is captured by a digital oscilloscope into a frequency-domain signal and then calculating an amplitude and a phase of a distortion.

Embodiment 5

Figure 16:
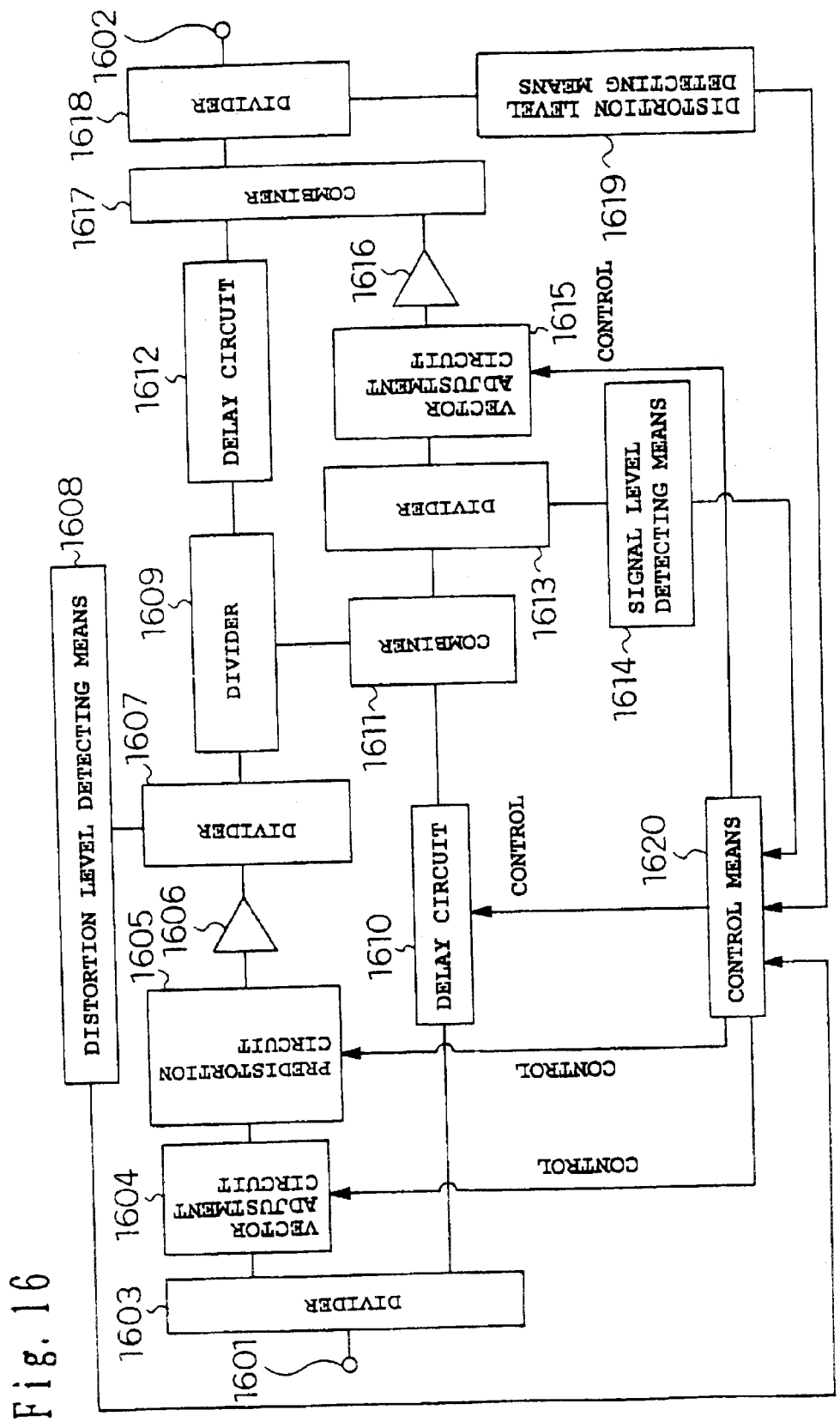
FIG. 16 is a block diagram showing the configuration of a feedforward amplifier according to a fifth embodiment of the invention.
Figure 17:
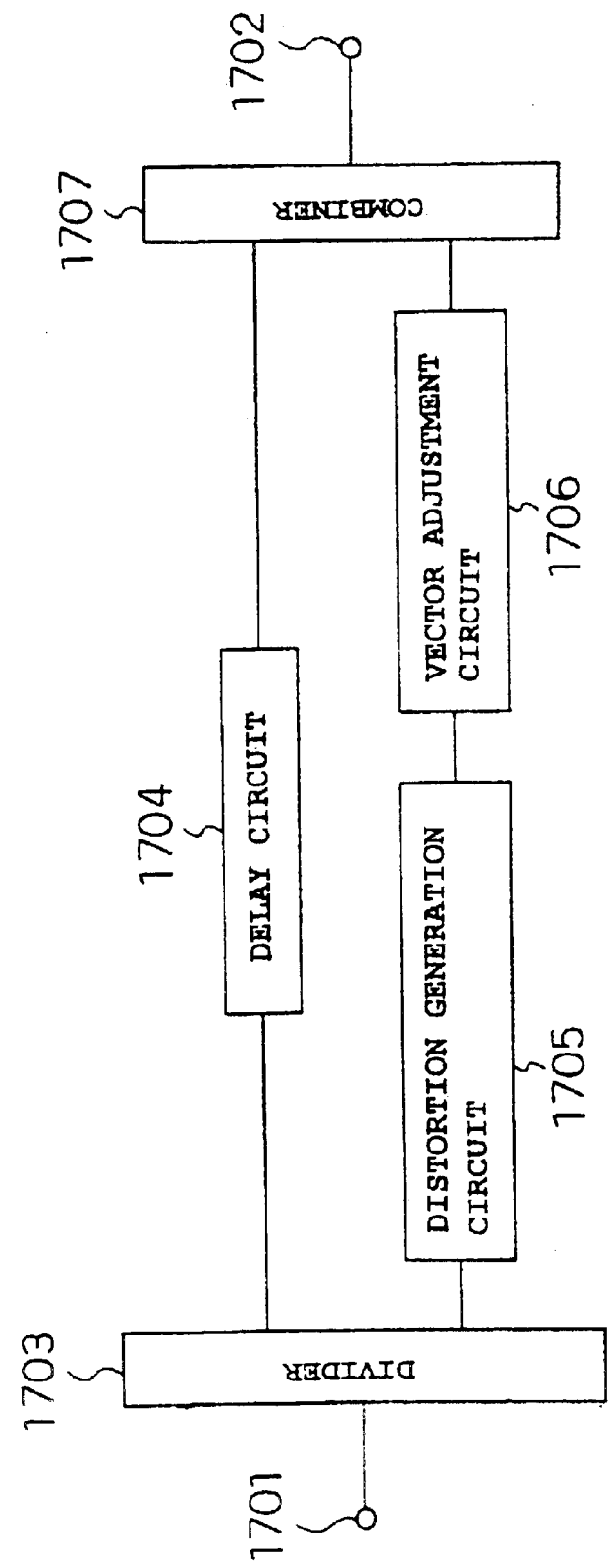
FIG. 17 is a block diagram showing the configuration of a conventional predistortion circuit.

A fifth embodiment of the invention will be hereinafter described with reference to FIG. 16.

A signal that is input to an input terminal 1601 is branched into two signals by a divider 1603. One branched signal is input to a power amplifier 1606 via a vector adjustment circuit 1604 and a predistortion circuit 1605 and amplified by the power amplifier 1606. The other branched signal is input to a combiner 1611 via a delay circuit 1610.

The signal that is input to the power amplifier 1606 is given a distortion component because of its nonlinearity. A resulting signal is branched into two signals by a divider 1609. One branched signal is input to a combiner 1617 via a delay circuit 1612.

The other branched signal produced by the divider 1609 is input to the combiner 1611. The two signals that are input to the combiner 1611 are combined together by the combiner 1611, whereby the carrier components are suppressed and only the distortion component is output.

The distortion component that is output from the combiner 1611 is input to the combiner 1617 via a divider 1613, a vector adjustment circuit 1615, and a power amplifier 1616.

The two signals that are input to the combiner 1617 are combined together, whereby the distribution components are suppressed and a signal having no distortion components is output.

To obtain a sufficient carrier suppressing effect in the combiner 1611, it is necessary that the two routes from the divider 1603 to the combiner 1611 have the same delay time and that the carrier components have the same amplitude and phases that are different from each other by 180°.

To this end, the one branched signal produced by the divider 1613 is detected by a signal level detecting means 1614. Resulting magnitude information of the branched signal is sent to a control means 1620, which controls the pass amplitude and the pass phase of the vector adjustment circuit 1604 so as to minimize the magnitude of the branched signal.

For the output of the combiner 1617 to be such that the distortion is suppressed sufficiently, it is necessary that the two routes from the divider 1609 to the combiner 1617 have the same delay time and that the distortion components that are input to the combiner 1617 have the same amplitude and phases that are different from each other by 180°.

To this end, the magnitude of the distortion level of the branched signal produced by a divider 1618 that is connected to the output of the combiner 1617 is detected by a distortion level detecting means 1619. Resulting magnitude information is sent to the control means 1620, which controls the vector adjustment circuit 1615 so as to minimize the magnitude.

The distortion generated by the power amplifier 1606 is branched by the divider 1607. The magnitude of the distortion level is detected by a distortion level detecting means 1608 and resulting magnitude information is sent to the control means 1620, which controls the predistortion circuit 1605 so as to minimize the magnitude.

The pass amplitude and phase are varied when the predistortion circuit 1605 is controlled, and hence the relationships between the amplitudes and the phases of the routes upstream of the combiner 1611 deviate from optimum ones, as a result of which a carrier component occurs in the output of the combiner 1611.

Therefore, if the control means 1620 controls the predistortion circuit 1605 and the vector adjustment circuits 1604 and 1615 simultaneously, it may not be able to perform controls so as to minimize the distortion.

In view of the above, first, the distortion level detecting means 1608 detects a distortion signal generated by the power amplifier 1606 and the control means 1620 controls only the predistortion circuit 1605 so as to minimize the level of the distortion signal. At this time, the control means 1620 does not control the vector adjustment circuits 1604 and 1615.

Then, the control means 1620 controls the vector adjustment circuit 1604 so as to minimize the level detected by the signal level detecting means 1614. At this time, the control means 1620 does not control the predistortion circuit 1605 and the vector adjustment circuit 1615.

Then, the control means 1620 controls the vector adjustment circuit 1615 so as to minimize the level detected by the distortion level detecting means 1619. At this time, the control means 1620 does not control the predistortion circuit 1605 and the vector adjustment circuit 1604.

Performing the above three controls in arbitrary order makes it possible to obtain maximum suppressing distortion The delay time of the predistortion circuit 1605 or the vector adjustment circuit 1604 may vary when it is controlled. One method for compensating for this variation in delay time is to employ, as the delay circuit 1610, a variable delay circuit whose delay time is variable and control it properly.

This is done in the following manner. A variation in delay time that occurs when the predistortion circuit 1605 or the vector adjustment circuit 1604 is controlled is measured in advance and stored in the control means 1620. When the control means 1620 later controls the predistortion circuit 1605 or the vector adjustment circuit 1604, it controls the variable delay circuit so as to compensate for the delay time variation. The addition of this control enables suppressing distortion of higher accuracy.

The distortion level detecting means may be a circuit that removes a carrier component with a notch filter and detects the magnitude of only a distortion component.

Although in the first embodiment the output terminal 102 of the predistortion circuit (see FIG. 1) is directly connected to the power amplifier 204 (see FIG. 2) as a subject of linearization, the invention is not limited to such a case; the former may be connected to the latter indirectly.

The above embodiments were mainly described for the case that the amplitude frequency characteristic adjustment circuit is provided upstream of the vector adjustment circuit (for examples, FIGS. 1, 7 and 12). However, the invention is not limited to such case; the invention is applicable to case where the amplitude frequency characteristic adjustment circuit is provided downstream of the vector adjustment circuit.

In the latter case, the predistortion circuit may be composed of comprising:

a divider for branching an input signal into plural branched signals;

a delay circuit for delaying one of the branched signals by a predetermined delay time;

a distortion generating circuit for receiving the other branched signal and for generating a distortion signal;

a vector adjustment circuit for varying an amplitude and a phase of the distortion signal; and an amplitude frequency characteristic adjustment circuit for varying an amplitude frequency characteristic of the distortion signal that is output from the vector adjustment circuit;

a combining circuit for combining an output signal of the delay circuit and an output signal of the vector adjustment circuit.

The above embodiments were mainly described for the case that both of the amplitude characteristics and the phase characteristics of the distortion characteristics of the power amplifier as a subject of linearization and the linearizer (for example, predistortion circuit) are different from each other. However, the invention is not limited to such a case; the invention is applicable to a case where only the phase characteristics are different from each other.

In the latter case, the predistortion circuit may be composed of a divider for distributing an input signal; a delay circuit connected to one output of the divider, for delaying a distributed input signal by a prescribed delay time; a distortion generation circuit connected to the other output of the divider; a vector adjustment circuit connected to the output of the distortion generation circuit, for varying the amplitude and the phase of a distortion signal; and a combiner for combining an output of the delay circuit with an output of the vector adjustment circuit and for outputting a combined signal to a downstream circuit means as a subject of linearlization to be connected to the combiner directly or indirectly. The delay time of the delay circuit is set based on a phase difference of a distortion that would be generated by the circuit means if the vector adjustment circuit did not produce the above output.

A specific configuration is one obtained by removing the amplitude frequency characteristic adjustment circuit 106 or 706 from the predistortion circuit of FIG. 1 or 7. Also in this case, a control in accordance with the degree of phase imbalance is enabled by adjusting the delay time of the delay circuit, which is similar to the effect attained by each of the above embodiments.

The above embodiments were mainly described for the case that both of the amplitude characteristics and the phase characteristics of the distortion characteristics of the power amplifier as a subject of linearization and the linearizer (for example, predistortion circuit) are different from each other. However, the invention is not limited to such a case; the invention is applicable to a case where only the amplitude characteristics are different from each other.

In the latter case, the predistortion circuit may be composed of a divider for distributing an input signal; a delay circuit connected to one output of the divider, for delaying a distributed input signal by a prescribed delay time; a distortion generation circuit connected to the other output of the divider; an amplitude frequency characteristic adjustment circuit connected to the output of the distortion generation circuit, for varying an amplitude frequency characteristic; a vector adjustment circuit connected to the output of the amplitude frequency characteristic adjustment circuit, for varying the amplitude and phase of a distortion signal; and a combiner for combining an output of the delay circuit with an output of the vector adjustment circuit.

A specific configuration is similar to the predistortion circuit of FIG. 1 and different from the latter in that the delay circuit 104 may be replaced by a conventional delay circuit. Also in this case, a control in accordance with the degree of amplitude imbalance is enabled by adjusting the amplitude frequency characteristic adjustment circuit in the above-described manner, which is similar to the effect attained by each of the above embodiments.

Although the above embodiments are directed to the case where the circuit means as a subject of linearization is a power amplifier, the invention is not limited to such a case. For example, the circuit means as a subject of linearization may be a linear amplifier or other circuit device or circuit component.

As is apparent from the above description, the invention provides advantages that a distortion of a power amplifier or the like that is unbalanced in amplitude or phase can be linearized for with a stable control.

What is claimed is:

1. A low-distortion power amplifier comprising:

a combining circuit for combining an input signal with another signal;

a power amplifier for receiving an output signal of the combining circuit;

a divider for branching an output signal of the power amplifier into plural branched signals;

a distortion extraction circuit for extracting a distortion signal from one of the branched signals;

an amplitude frequency characteristic adjustment circuit for varying an amplitude frequency characteristic of the distortion signal; and a vector adjustment circuit for varying an amplitude and a phase of the distortion signal that is output from the amplitude frequency characteristic adjustment circuit, wherein an output signal of the vector adjustment circuit is input to the combining circuit as said another signal and the other branched signal is output from the low-distortion power amplifier.

2. The control method for the low-distortion power amplifier according to any one of claims 1, comprising the steps of:

detecting a magnitude of the distortion signal that is output from the distortion extraction circuit; and controlling at least one of the amplitude frequency characteristic adjustment circuit or circuits and the vector adjustment circuit or circuits so as to minimize the detected magnitude of the distortion signal.

* * * * *

UNITED STATES PATENT AND TRADEMARK OFFICE
CERTIFICATE OF CORRECTION

PATENT NO. : 6,960,958 B2
DATED : November 1, 2005
INVENTOR(S) : Matsuura et al.

It is certified that error appears in the above-identified patent and that said Letters Patent is hereby corrected as shown below:

<u>Column 18,</u>
Lines 13-21, should read:
-- 2. The control method for the low-distortion power amplifier according to claim 1, comprising the steps of:
   detecting a magnitude of the distortion signal that is output from the distortion extraction circuit; and
   controlling at least one of the amplitude frequency characteristic adjustment circuit or circuits and the vector adjustment circuit or circuits so as to minimize the detected magnitude of the distortion signal. --.

Signed and Sealed this

Thirtieth Day of May, 2006

JON W. DUDAS
*Director of the United States Patent and Trademark Office*